(12) United States Patent
Wilk et al.

(10) Patent No.: US 6,770,536 B2
(45) Date of Patent: Aug. 3, 2004

(54) PROCESS FOR SEMICONDUCTOR DEVICE FABRICATION IN WHICH A INSULATING LAYER IS FORMED ON A SEMICONDUCTOR SUBSTRATE

(75) Inventors: Glen David Wilk, New Providence, NJ (US); Peide Ye, Basking Ridge, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/263,638

(22) Filed: Oct. 3, 2002

(65) Prior Publication Data

US 2004/0067660 A1 Apr. 8, 2004

(51) Int. Cl.$^7$ .................. H01L 21/8236; H01L 21/4763
(52) U.S. Cl. ...................... 438/287; 438/240; 438/624; 438/626; 438/678
(58) Field of Search .................................. 438/197–200, 438/585–596, 3, 240, 287, 591, 624, 626, 678, 681, 685; 257/406–411

(56) References Cited

U.S. PATENT DOCUMENTS

| | | |
|---|---|---|
| 4,058,430 A | 11/1977 | Suntola et al. |
| 4,276,137 A | 6/1981 | Hovel et al. |
| 4,366,493 A | 12/1982 | Braslau et al. |
| 4,632,713 A | 12/1986 | Tiku |
| 4,798,165 A | 1/1989 | deBoer et al. |
| 4,811,077 A | 3/1989 | Fowler et al. |
| 4,843,450 A | 6/1989 | Kirchner et al. |
| 5,746,826 A * | 5/1998 | Hasegawa et al. ............ 117/90 |
| 5,923,056 A * | 7/1999 | Lee et al. .................... 257/192 |
| 5,962,883 A | 10/1999 | Hong et al. |
| 6,030,453 A | 2/2000 | Passlack et al. |
| 6,107,562 A * | 8/2000 | Hashimoto et al. ......... 136/252 |
| 6,150,680 A | 11/2000 | Eastman et al. |
| 6,200,866 B1 * | 3/2001 | Ma et al. ..................... 438/299 |
| 6,203,613 B1 * | 3/2001 | Gates et al. ................ 117/104 |
| 6,245,606 B1 | 6/2001 | Wilk et al. |
| 6,271,094 B1 | 8/2001 | Boyd et al. |
| 6,287,965 B1 * | 9/2001 | Kang et al. ................. 438/648 |
| 6,297,539 B1 * | 10/2001 | Ma et al. ..................... 257/410 |
| 6,342,277 B1 * | 1/2002 | Sherman ..................... 427/562 |
| 6,355,561 B1 * | 3/2002 | Sandhu et al. ............. 438/676 |
| 6,462,367 B2 * | 10/2002 | Marsh et al. ................ 257/295 |
| 6,511,876 B2 * | 1/2003 | Buchanan et al. .......... 438/240 |
| 6,518,634 B1 * | 2/2003 | Kaushik et al. ............. 257/406 |
| 6,551,399 B1 * | 4/2003 | Sneh et al. ................. 117/102 |
| 6,551,929 B1 * | 4/2003 | Kori et al. ................... 438/685 |
| 6,559,472 B2 * | 5/2003 | Sandhu et al. ................ 257/31 |
| 6,617,173 B1 * | 9/2003 | Sneh ............................. 438/3 |

* cited by examiner

Primary Examiner—Michael Lebentritt

(57) ABSTRACT

The present invention provides a method for manufacturing a semiconductor device comprising a III–V semiconductor substrate, and an insulating layer deposited on the substrate by Atomic Layer Deposition (ALD). The use of ALD to deposit the insulating layer was found to facilitate the creation of active devices that avoid Fermi layer pinning. In addition, such insulating layer may be advantageously used as a passivation layer in III–V substrate based active devices and transistors.

10 Claims, 5 Drawing Sheets

US 6,770,536 B2

PROCESS FOR SEMICONDUCTOR DEVICE FABRICATION IN WHICH A INSULATING LAYER IS FORMED ON A SEMICONDUCTOR SUBSTRATE

TECHNICAL FIELD OF THE INVENTION

The present invention is directed, in general, to a semiconductor device and, more specifically, to a semiconductor device having an insulating layer formed on a III–V semiconductor substrate by Atomic Layer Deposition and a method of manufacture thereof.

BACKGROUND OF THE INVENTION

High speed active device applications in the telecommunication industry based on III–V semiconductors offer a number of advantages over devices based on Silicon semiconductors. The broad application of III–V semiconductors in such devices has been problematic, however. It has been difficult, for example, to incorporate GaAs into metal oxide semiconductor field effect transistors (MOSFETs). Specifically, it has proven difficult to form an insulating layer of oxide or high dielectric constant material on GaAs semiconductor substrates and still obtain a functional device.

It is thought that the Fermi level of the GaAs semiconductor substrate at an interface between the GaAs and the insulating layer is substantially pinned, arising from a poor-quality interface characteristic of III–V surfaces, resulting in an MOSFET that has inadequate performance characteristics for functional device applications. Inadequate performance characteristics associated with pinning include insensitivity in a change in the MOSFET's drain current in response to a bias voltage applied to the gate for a given input voltage. This may manifest, for example, as a low transconductance or by an inability of the drain current to change as the bias voltage changes from positive or negative or vice versa.

The use of III–V semiconductors has therefore been limited largely to devices, such as metal semiconductor field effect transistors (MESFETs), that do not have an insulating layer on the III–V semiconductor. High leakage currents remain a drawback of such devices, because there is an inherently low energy barrier (about 0.7 eV) between the III–V semiconductor and the overlying conducting layer. The use of such III–V based MESFETs is also problematic in high voltage applications, such as base stations of cell phone systems where it is desirable to amplify a weak RF signal. In such applications, a high positive voltage (e.g., in excess of about 2 V) can not be applied to the gate. If a high positive voltage is applied then a current may run between the gate and the drain or source along the surface of the III–V semiconductor, thereby causing a breakdown of the MESFET.

Accordingly, what is needed in the art is a semiconductor device and method of manufacturing thereof that does not exhibit the limitations of the prior art.

SUMMARY OF THE INVENTION

To address the above-discussed deficiencies of the prior art, the present invention provides a method of manufacturing a semiconductor device. The method includes providing a III–V semiconductor substrate and depositing by Atomic Layer Deposition, an insulating layer on the III–V semiconductor substrate. Another embodiment of the present invention is an active device comprising the above-described III–V semiconductor substrate and insulating layer on the substrate.

Still another embodiment is directed to a transistor, comprising a III–V semiconductor substrate, a gate located on the III–V semiconductor substrate, a source and a drain formed in or on said III–V semiconductor substrate, and the above-described insulating layer. The insulating layer is deposited on the III–V semiconductor substrate, by Atomic Layer Deposition, between at least one of the source or drain regions and the gate. Moreover, the insulating layer is capable of acting as a passivation layer to hinder surface currents when a bias voltage is applied to the gate.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes for the first time that Atomic Layer Deposition (ALD) may be used to advantageously deposit an insulating layer on a III–V semiconductor substrate, to produce a active device where the substrate has an unpinned Fermi Level. Alternatively, the insulating layer may be used as a passivation layer to hinder surface currents in high voltage transistor power applications. Though not limiting the scope of the invention by theory, it is thought the deposition of the insulating layer via ALD helps to substantially reduce traps at the surface of the substrate that lead to pinning.

Figure 1:
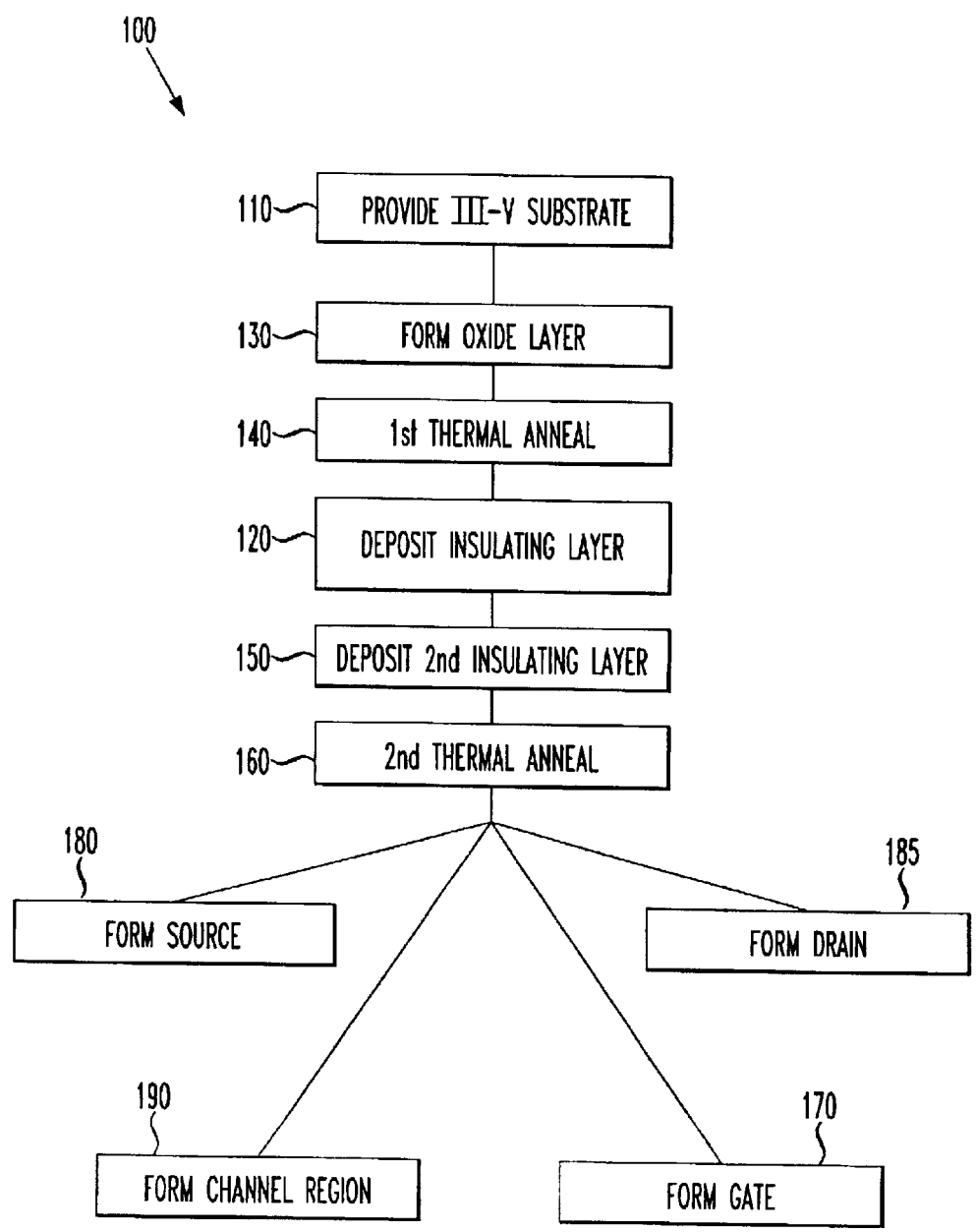
FIG. 1 illustrates, by flow diagram, a method of manufacturing a semiconductor device according to the principles of the present invention.

Referring initially to FIG. 1, illustrated by flow diagram is a method of manufacturing a semiconductor device 100 according to the principles of the present invention. The method 100 comprises providing a III–V semiconductor substrate 110; and depositing by Atomic Layer Deposition an insulating layer on the III–V semiconductor substrate 120.

Any conventional III–V semiconductor substrate may be used in the present invention. In certain preferred embodiments, for example, the substrate comprises GaAs, InP, or GaN. Other preferred embodiments include AlGaAs or InGaAs surfaces on GaAs-based substrates; InGaAs or AlInAs surfaces on InP-based substrates; and an AlGaN surface on GaN-based substrates. In other advantageous embodiments, the III–V semiconductor substrate has an epiready surface thereon. The term epiready surface as used herein, refers to a III–V semiconductor substrate having a surface, comprising the same III–V material, that has been grown by conventional molecular beam epitaxy, for example. Those of ordinary skill in the art are aware of the procedures for preparing epiready III–V semiconductor substrates.

The method 100 may also include a step 130 of forming an oxide layer on the III–V semiconductor substrate before depositing the insulating layer. Any conventional process for forming a oxide layer may be used. Forming the oxide layer 130 is preferably performed by exposing the III–V semiconductor substrate to air. Alternatively, forming the oxide layer 130 may be achieved by exposing the III–V semiconductor substrate to ozone, or mixtures of air and ozone. The temperature and period of exposure should be sufficient to allow the formation of uniform oxide layer over the entire surface of the III–V substrate. For example, in certain embodiments, the III–V semiconductor substrate is exposed to air at room temperature for at least about 5 minutes.

The method 100 may further include a step 140 of performing a thermal anneal of the III–V semiconductor substrate before depositing the insulating layer. The thermal anneal may comprise maintaining the III–V semiconductor substrate at a temperature ranging from about 200° C. to about 400° C. for between about 5 and 500 minutes. More preferably, the thermal anneal comprises maintaining a temperature from about 300° C. to about 400° C. for between about 5 and 30 minutes. Preferably, the oxide layer is formed 130 prior to the thermal anneal 140, although the reverse order is also within the scope of the present invention.

The step 120 of depositing the insulating layer by ALD may include any conventional steps, such as that disclosed in U.S. Pat. No. 4,058,430, to Suntola et al., incorporated by reference herein, known to one skilled in the art. Typically, depositing by ALD comprises alternating the introduction into a chamber that holds the III–V semiconductor substrate, a first insulating layer precursor and a second insulating layer precursor. The first insulating layer precursor may comprise any number of metal containing compounds commonly used in ALD. Such compounds, for example, may include: $Al(CH_3)_3$, $HfCl_4$, $ZrCl_4$, $TaCl_5$, $Y(2,2,6,6\text{-tetramethyl-3,5-heptanedionato})_3$, $La(2,2,6,6\text{-tetramethyl-3,5-heptanedionato})_3$, $SiH_4$, $TiCl_4$ and mixtures thereof. Likewise, the second precursor may comprise any compound commonly used to facilitate growth of the insulating layer. Such compounds, for example, may include: $H_2O$, $H_2O$ and $O_3$, $NH_3$, and mixtures thereof. Additional components may include plasma $N_2$, plasma $H_2$, and plasma $NH_3$. The chamber is maintained at between about 200 and about 600° C., and more preferably between about 250 and about 400° C. during deposition 120. An insulating layer of any thickness may be deposited by ALD 120, although typically the insulating layer is between about 0.5 and about 100 nm thick.

Designating the insulating layer deposited by ALD as a first insulating layer, the method 100 may also include a step 150 of depositing a second insulating layer. Any conventional non-ALD process may be used to form second insulting layer. Preferably the process is capable of forming the second insulting layer more rapidly than the first layer that was formed by ALD. Examples of such processes include electron beam evaporation; sputtering; plasma assisted deposition; and metal-organic chemical vapor deposition. In certain applications, for example, where the device manufactured is a MOSFET, the second insulating layer thickness may range between about 50 and about 500 nm.

The method 100 may additionally include a step 160 of performing a second thermal anneal after depositing the insulating layer. In certain embodiments, the second thermal anneal is a rapid thermal anneal, performed at a temperature ranging from about 400° C. to about 800° C. for between about 1 and about 600 seconds. The second anneal may be performed in the presence of an inert gas such as Argon, Nitrogen and Helium. In certain preferred embodiments, the second thermal anneal is performed at a temperature ranging from about 600° C. to about 650° C. for between about 30 and about 60 seconds. Moreover, the second anneal may be advantageously performed in the presence of an oxidizing gas such as oxygen, nitric oxide, nitrous oxide and ozone.

In certain preferred embodiments, the semiconductor device is a MOSFET, the method 100 may further include the steps of forming a gate 170, source 180 and drain 185 regions and a channel region 190 between the source and drain regions using conventional processes. As further discussed below, such MOSFET devices have desirably low trap densities and high transconductance and other favorable electrical properties.

Moreover, the high thermal stability of certain III–V substrates such as GaAs, and certain insulating layers such as $Al_2O_3$, $HfO_2$ or $ZrO_2$, facilitates the use of desirable high temperature processing steps for the production of enhancement mode MOSFET devices. For example, the channel region can be formed by conventional methods known to those skilled in the art, such as by molecular beam epitaxial growth of a p-doped channel. Examples of a p-type dopants are zinc or beryllium. A distinct advantage of the present invention lies in the formation of the highly doped source and drain regions of the device. Using gate insulators with high thermal stability, as afforded by the present invention, allows the formation of a very small gate lengths, with self-aligned gate and source/drain regions after the insulating gate dielectric and conducting gate electrode have been deposited. To form highly doped n+ source and drain regions, as is required for enhancement-mode devices, further discussed below, an n-type dopant, such as Si, can be ion implanted into the source and drain regions. This is followed by thermal activation (i.e., between about 700° C. and 800° C.) of the implanted dopants, to form the n+ doped source and drain regions. This process allows precise alignment between the gate and source and drain regions, and thereby facilitates the use of self-aligned, smaller gate lengths for enhancement-mode devices.

The present invention also allows processing of greatly improved depletion-mode devices, which operate in a "normally on" mode, meaning that there is current flow through the channel and drain regions, even when there is no bias voltage on the gate. For such a depletion-mode device, the n-type channel can be formed by conventional methods known to those skilled in the art, such as epitaxially by molecular beam epitaxy (MBE) or metal-organic chemical vapor deposition (MOCVD) of an n-doped channel. Analogous to that discussed above, to form highly doped n+ source and drain regions, as is required for depletion-mode devices, an n-type dopant, such as Si, can be ion implanted into the source and drain regions. Again, this is followed by thermal activation (i.e., between about 700° C. and 800° C.) of the implanted dopants, to form the n+ doped source and drain regions. As with enhancement-mode devices, this process allows precise alignment between the gate and source and drain regions, and thereby facilitates the use of self-aligned, smaller gate lengths for depletion-mode devices.

Figure 2:
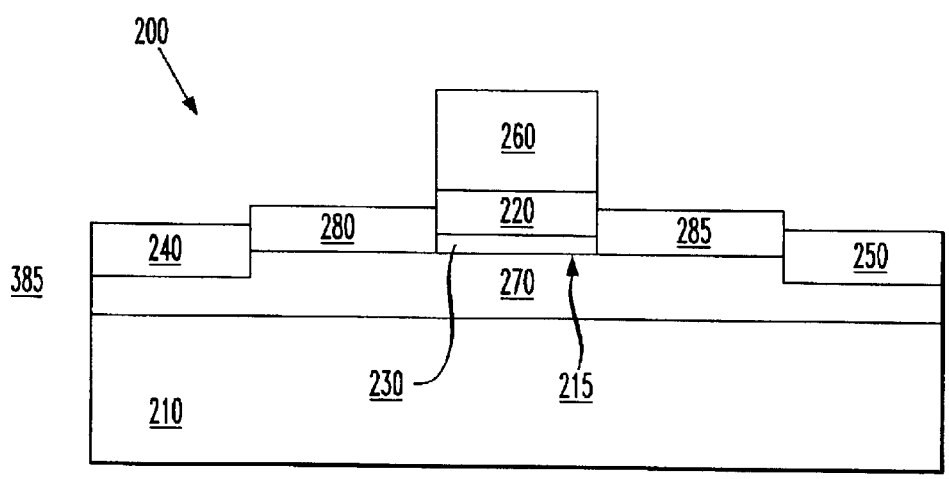
FIG. 2 illustrates a sectional view of an exemplary active device of the present invention.

FIG. 2 illustrates an exemplary embodiment of an another aspect of the present invention, an active device 200. The device 200 comprises a III–V semiconductor substrate 210 and an insulating layer 220 deposited on the III–V semiconductor substrate 210 by Atomic Layer Deposition.

Any of the methods and preferred embodiments described herein may be used to fabricate the active device 200. In certain embodiments, an interface region 215 of the III–V semiconductor substrate 210 between the substrate 210 and the insulating layer 220 has a trap density of less than about $10^{12}$ traps/cm$^2$, and more preferably, between about $10^{12}$ and about $10^{11}$ traps/cm$^2$. The term trap density refers to electrically active defects in the III–V semiconductor substrate that are capable of trapping charge carriers, resulting in Fermi level pinning, low transconductance and other deleterious effect well known to those of ordinary skill in the art.

The insulating layer 220 may be comprised of any conventional insulating material used in semiconductor applications and conducive with being applied by ALD. The insulating layer 220 may be comprised of $SiO_2$ or $Si_3N_4$, for example. More preferably, the insulating layer 220 has a dielectric constant of greater than about 8. The term dielectric constant as used herein refers to the multiplicative factor of the dielectric constant of the material of interest, as compared to the dielectric constant of air (about $8.85 \times 10^{-14}$ farad/cm). The term "high K dielectric" as used herein refers to a material whose dielectric constant relative to air is at least about 8. Examples of such high K dielectric materials include $HfO_2$, $ZrO_2$, $Ta_2O_5$, $TiO_2$, $Y_2O_3$, $La_2O_3$ HfN and AlN.

Even more preferably, the insulating layer 220 comprises $Al_2O_3$. $Al_2O_3$ is a preferred insulating material because, in addition to having a high dielectric constant, an insulating layer 220 comprised of $Al_2O_3$ has a high band gap (e.g., about 9 eV). Therefore, MOSFET devices including such structures can tolerate higher applied bias voltages before breaking down. Moreover, $Al_2O_3$ has high thermal stability, being stable at temperatures up to at least about 1000° C. Thus, the use of $Al_2O_3$ as an insulating layer 220 is conducive with various conventional high temperature processing steps used in the fabrication of active devices described herein.

The device 200 may further include an oxide layer 230 on the III–V semiconductor substrate 210 between the substrate 210 and the insulating layer 220. In certain embodiments, the oxide layer 230 has a thickness of, for example, between about 0.5 nm and about 1 nm. An oxide layer 230 is preferred because this is thought to facilitate a reduction in trap density in cooperation with deposition of the insulating layer 220 via ALD.

One preferred embodiment of the active device 200 is a MOSFET. In such embodiments, the device 200 further includes a source and a drain region 240, 250 located in or on the III–V semiconductor 210, a gate 260 on the insulating layer 220 and channel region 270 between the source 240 and drain 250. The source and drain 240, 250 may be comprised of any conventional materials, such as Germanium, Gold, Nickel and stacked combinations or mixtures thereof. Similarly, any conventional conductive material may be used as the gate 260. Non-limiting examples of gate materials include Aluminum, Titanium, Gold, Silver, Platinum, refractory metals selected from the group consisting of Tungsten, Rhenium, Tantalum, Molybdenum and Niobium, a refractory metal silicide of any of the above-mentioned metals, such as $WSi_2$, polysilicon, polycide and combinations thereof. In certain preferred embodiments a stack of Titanium on Gold is used as the gate 260.

In other preferred embodiments, for example, when the device 200 is a MOSFET, the MOSFET is capable of operating when either a positive or a negative bias voltage is applied to the gate 260. In certain embodiments, for example, the positive bias voltage is up to about 30 V and the negative bias voltage is up to about −30 V. Moreover, in other embodiments, as further illustrated in the Experimental section to follow (FIG. 5), the MOS capacitor shows that the Fermi level is not pinned, since the capacitor can achieve depletion and accumulation under varying gate voltage biases, with the expected characteristic behavior. Similarly, the Channel region 270 may be formed by any conventional techniques, such as molecular beam epitaxy (MBE) or metal-organic chemical vapor deposition (MOCVD).

In other preferred embodiments, when the device 200 is a MOSFET, the device 200 has a transconductance of greater than about 2 mS/mm, more preferably about 30 mS/mm, and even more preferably between about 100 and about 130 mS/mm. The term transconductance (Gm) as used herein refers to current flow in the channel of a field effect transistor. Transconductance may be calculated from the linear portion of plots, such as that discussed in the Experimental section to follow (FIG. 4), to provide a slope in units of in milliSiemens per mm of gate width (mS/mm).

In still other preferred embodiments, the device 200 is an enhancement mode MOSFET. The term enhancement mode MOSFET as used herein, refers to a MOSFET device that, in the absence of an applied bias voltage, is in an "off" (i.e., nonconducting) state. An enhancement mode MOSFET comprise a p-type dopant formed in a channel region 270 in the III–V semiconductor substrate 210, using the processes such as ion implantation, MBE or MOCVD grown p-type doped epi-layer, as discussed elsewhere herein. Enhancement mode MOSFETs are advantageous in portable device applications, where it is desirable not to draw on a limited power supply, such as a battery, when the device is not in use. Another advantegous application in the fabrication of Complementary MOS logical circuits, in particular, the fabrication of n-type and p-type devices integrated on the same semiconductor logic chip.

In other embodiments, however, the device 200 may be a depletion mode MOSFET. The term depletion mode MOSFET as used herein, refers to a device 200 that in the absence of an applied bias voltage, is in an "on" state, meaning that the device 200 draws current from a power supply. Depletion mode MOSFETs comprise a n-type dopant formed in a channel region 270 in the III–V semiconductor substrate 210, via conventional processes such as a n-type epitaxial layer grown by MBE, MOCVD or implanted with an n-type dopant such as Si.

In another preferred embodiment of the active device 200, further includes the insulating layer 280, between at least one of the source region 240 and the gate 260, or the insulating layer 285 between the drain region 250 and said gate 260. Such insulating layers 280, 285 are capable of acting as a passivation layer to hinder surface currents when a bias voltage is applied to the source 240, drain 250 or gate 260. Typically, for example, bias voltage is applied to the source 240, drain 250 and gate 260, where one or more of the bias voltages, for example on the source 240, equals zero volts.

Figure 3:
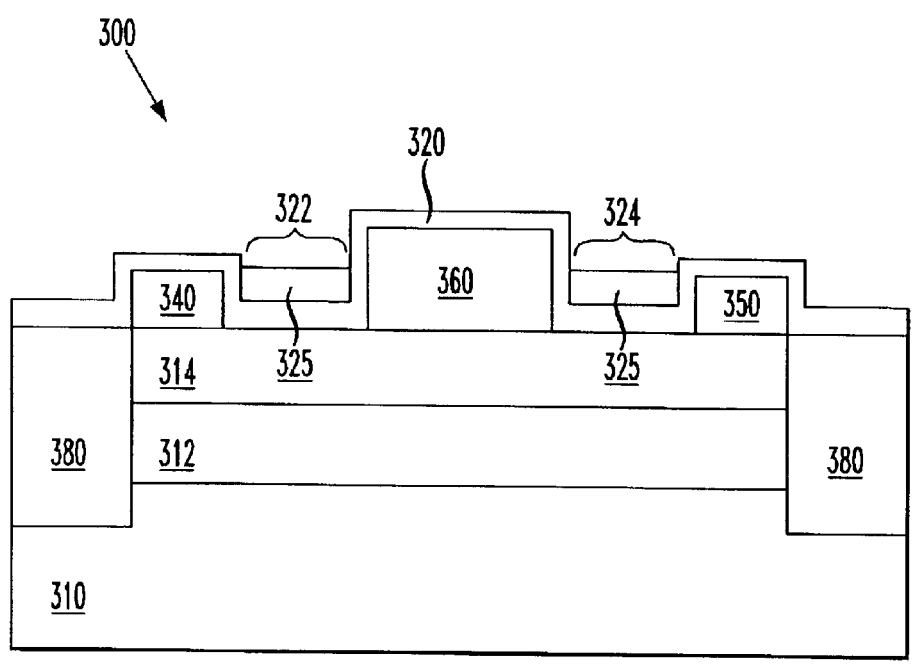
FIG. 3 illustrates a sectional view of an exemplary transistor device of the present invention.

FIG. 3 illustrates an exemplary embodiment of an another aspect of the present invention, a transistor 300. Using a numbering scheme analogous to that used in FIG. 2, the transistor 300 includes a III–V semiconductor substrate 310, a conventionally formed gate 360 located on said III–V semiconductor substrate 310, a conventionally formed source and drain 340, 350 formed in or on said III–V semiconductor substrate 310. The insulating layer 320 is deposited on the III–V semiconductor substrate by ALD as described elsewhere herein. In contrast to the device 200 in FIG. 2, however, the insulating layer 320 is in regions 322, 324 between at least one of the source or drain region 340, 350 and the gate 360. The insulating layer 320 is capable of acting as a passivation layer to hinder surface currents when a bias voltage is applied to the source 340, drain 350 and gate 360. As noted above, typically bias voltage is applied to the source 340, drain 350 and gate 360. Alternatively, as depicted in FIG. 3, the insulating layer 320 may be deposited over the entire surface of the transistor 300.

In certain preferred embodiments, the transistor 300 is a MESFET used in high voltage power applications. In such embodiments, the transistor 300 may further comprise an undoped III–V semiconductor buffer layer 312 on the III–V semiconductor substrate 310 and a doped III–V semiconductor layer 314 on the undoped III–V buffer layer 312. The dopant in the doped III–V semiconductor may be, for example, Silicon, for an n-type channel in a depletion-mode device, or beryllium or zinc, for a p-type channel in an enhancement-mode device. The III–V semiconductor may be GaAs, and the undoped III–V semiconductor buffer layer 312 may be formed by epitaxial growth by MBE or MOCVD. In such embodiments, the source and drain 340, 350 and the gate 360 are formed in or on the doped III–V semiconductor layer 314. In still other embodiments, the insulating layer 320, in addition to being deposited on the doped III–V semiconductor layer 314, is also deposited on the source and drain 340, 350 and the gate 360. Advantageous embodiments of the transistor 300 may further include isolation regions 380, comprised of for example, $O^+$ or $He^{++}$, implanted into the III–V semiconductor substrate via conventional ion implantation techniques to improve the electrical isolation of the transistor from other device components.

Analogous to that discussed for the active device 200, in certain preferred embodiments, where the insulating layer 320 is designated as a first insulating layer 320, a second insulating layer 325 may be deposited on the first insulating layer 320, with the second insulating layer 325 deposited by a non-Atomic Layer Deposition process. Examples of such processes include electron beam evaporation; sputtering; plasma assisted deposition; and metal-organic chemical vapor deposition. Such processes may be used when it is desirable to rapidly deposit an additional insulating layer 325 on the insulating layer deposited by ALD. In such embodiments, for example, when the first insulating layer 320 has a thickness between about 1 nm and about 50 nm then the first insulating layer 320 plus said second insulating layer 325 together have a thickness of at least about 500 nm.

Having described the present invention, it is believed that the same will become even more apparent by reference to the following examples. It will be appreciated that the examples are presented solely for the purpose of illustration and should not be construed as limiting the invention. For example, although the experiments described below may be carried out in laboratory setting, one of ordinary skill in the art could adjust specific numbers, dimensions and quantities up to appropriate values for a full scale plant.

EXAMPLES

Devices, similar to that depicted in FIG. 2 were made according to the principles of the present invention and then the electrical properties of the devices were tested.

A set of active devices included a GaAs semiconductor substrate having a about 70 nm thick n-doped layer introduced by a conventional MBE process. The dopant concentration was about $4 \times 10^{17}$ atoms/cm$^3$ and the dopant was Si. The active device further included a source and drain comprising Au/Ge and Ni and formed by a conventional Ohmic process. The width of the channel ($W_{ch}$) between the source and drain was about 100 microns and the channel length ($L_{ch}$) was about 1 micron.

A native oxide layer was allowed to form on the GaAs substrate by exposing the substrate to air at room temperature for about 5 minutes. The substrate was then transferred to the deposition chamber of a commercial Atomic Layer Desposition device (Pulsar 2000™, ASM International N.V., Bilthoven, the Netherlands) and heated to a temperature of about 300° C. for about 5 minutes, to desorb hydrocarbons and prepare the surface for a high-quality interface with ALD growth. An about 16 nm thick insulating layer of $Al_2O_3$ was deposited on the GaAs substrate at about 300° C. by alternately including pulses of trimethyl aluminum and water vapor in a nitrogen gas stream passed over the substrate, with a purging interval of the nitrogen gas purge in-between the pulses. A rapid thermal anneal was performed after depositing the insulating layer, by heating to about 600° C. for about 60 s in the presence of oxygen gas. Finally, a conductive layer comprising an about 10 nm layer of Titanium on an about 90 nm layer of Gold was deposited on the insulating layer by a conventional evaporation process, and then patterned to form a gate.

Figure 4:
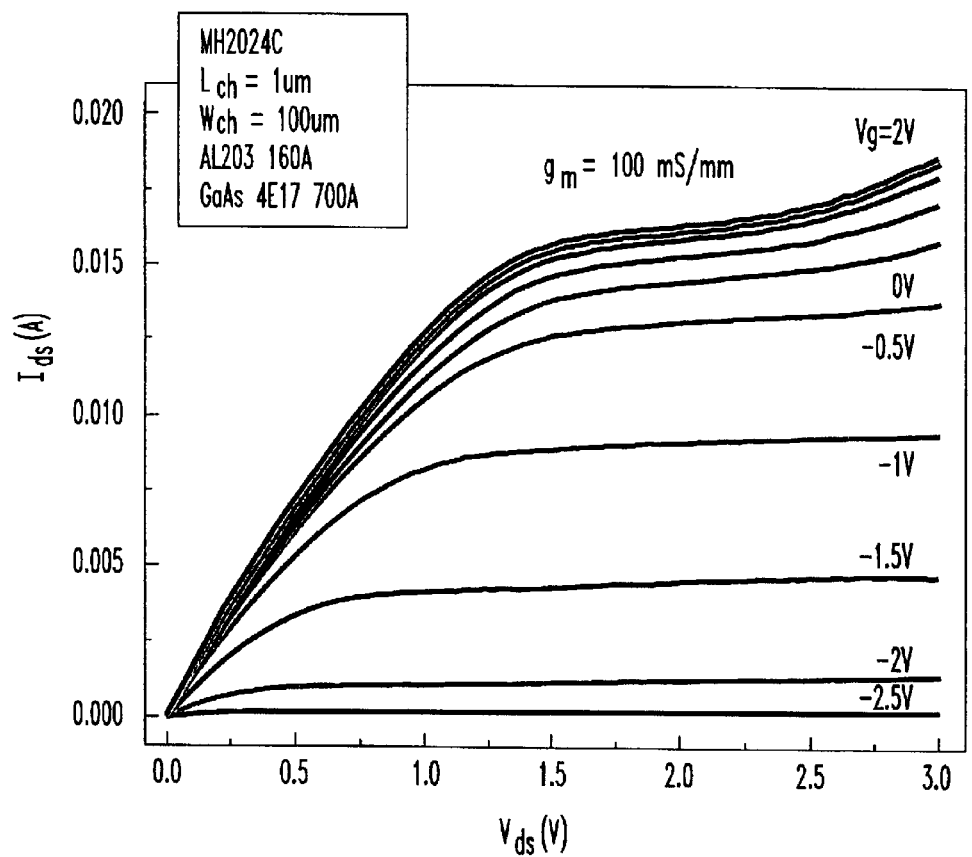
FIG. 4 illustrates the relationship between current and voltage applied between source and drain for different bias voltages applied to the gate for an exemplary MOSFET device constructed according to the principles of the present invention.

FIG. 4 shows the representative data of the relationship between current ($I_{ds}$) and voltage ($V_{ds}$) between the source and drain for different applied gate voltages ($V_g$). That the transistor is unpinned is demonstrated by the increase in $I_{ds}$ as $V_g$ increases from about −2.5 V to about +2 V. By comparison, a pinned device would be expected to show little to no increase in $I_{ds}$ as $V_g$ is increased. Also by comparison, a MESFET device, having no insulating layer, would be expected to break down if such positive gate voltages were applied. The transconductance ($g_m$) of the transistor, calculated for the linear portion of the plot of $I_{ds}$ versus $V_{ds}$ for $V_g$ equal to about +2V, was about 100 mS/mm.

A first set of capacitors were fabricated similar to that described above for the active device. The capacitors comprised about 150 nm thick Al metal films about 75, 100, 150, and 200 microns in diameters. A Ti/Au metal film was deposited on the backside of the n+ doped GaAs substrate. The insulating layer of $Al_2O_3$ was about 8 nm thick, and no rapid thermal anneal was performed after depositing the insulating layer. For comparison, a second set of capacitors were fabricated the same as the first set of capacitors except that a rapid thermal anneal was performed (650° C. for 60 s in the presence of oxygen).

Figures 5A, 5B:
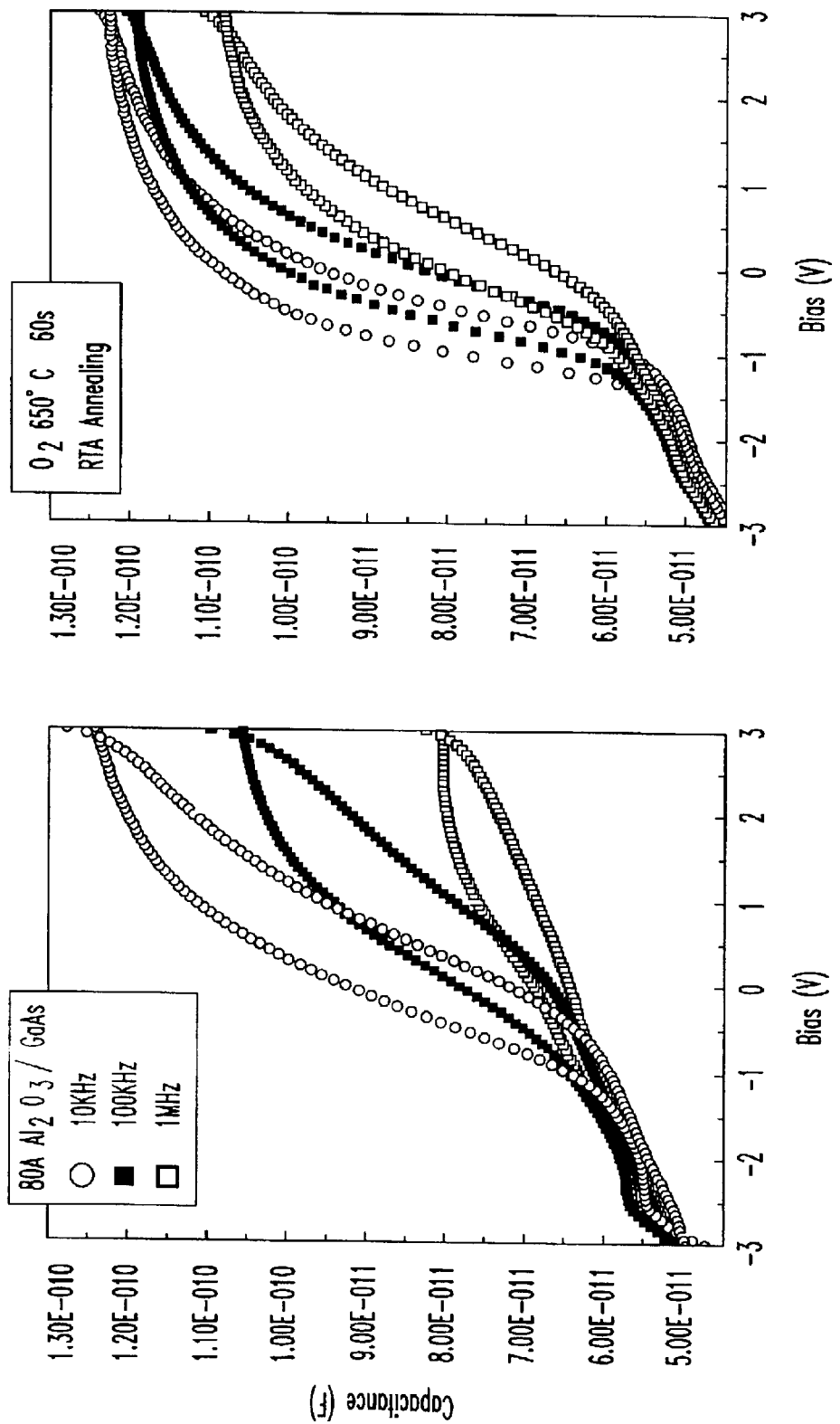
FIG. 5 illustrates the relationship between capacitance and bias voltage applied to the gate of an exemplary MOS capacitor device for three different frequencies and measured from a negative to positive and then a positive to negative applied bias voltage.

The capacitors were measured for three different frequencies of alternating small-signal voltage (about 10 kHz, about 100 kHz and about 1 MHz) applied on the gate while sweeping the bias voltage ("Bias") applied to the gate from about +3V to about −3 V. Exemplary results obtained from the first and second capacitor sets are shown in FIGS. 5A and 5B, respectively. That both the first and second capacitor sets were unpinned is indicated by the increase in capacitance as a function of increasing bias voltage from negative to positive. A comparison of the plots in FIG. 5A versus 5B, indicates a number of beneficial effects from performing the thermal rapid thermal anneal. For example, the second capacitor set (FIG. 5B) as compared to the first capacitor set (FIG. 5A), had reduced hysteresis between positive to negative versus negative to positive bias voltage sweeps, decreased dependence of capacitance on the frequency of the alternating current, and increased capacitance, especially at higher frequencies.

Although the present invention has been described in detail, one of ordinary skill in the art should understand that they can make various changes, substitutions and alterations herein without departing from the scope of the invention.

What is claimed is:

1. A method of manufacturing a semiconductor device, comprising:
providing a III–V semiconductor substrate;
performing a thermal anneal of said III–V semiconductor substrate, said thermal anneal comprising a temperature of between about 200° C. and about 400° C. for between about 5 and about 500 minutes; and
depositing by Atomic Layer Deposition an insulating layer on said III–V semiconductor substrate.

2. The method as recited in claim 1, wherein said thermal anneal is performed before depositing said insulating layer.

3. The method as recited in claim 1, further including forming an oxide layer on said III–V semiconductor substrate before depositing said insulating layer.

4. The method as recited in claim 1, wherein said insulating layer is between about 0.5 and about 100 nm thick.

5. The method as recited in claim 1, wherein said insulating layer is a first insulating layer and said method further comprises depositing a second insulating layer on said first insulating layer using a non-Atomic Layer Deposition process.

6. The method as recited in claim 1, further comprising performing a second thermal anneal after depositing said insulating layer.

7. The method as recited in claim 1, wherein said semiconductor device is a metal oxide semiconductor field effect transistor (MOSFET) and said method includes forming a gate, source and drain regions and a channel region between said source and drain regions, said MOSFET having a trap density of less than about $10^{12}$ traps/cm$^2$.

8. The method as recited in claim 7, wherein said MOSFET device has a transconductance of greater than about 2 mS/mm.

9. The method as recited in claim 1, wherein said thermal anneal is performed after depositing said insulating layer.

10. The method as recited in claim 1, wherein said temperature is between about 200° C. and about 300° C.

* * * * *